United States Patent [19]
Morris, Jr. et al.

[11] Patent Number: 5,004,978
[45] Date of Patent: Apr. 2, 1991

[54] METHOD FOR REGENERATING IN-CIRCUIT TEST SEQUENCES FOR CIRCUIT BOARD COMPONENTS

[75] Inventors: Carroll E. Morris, Jr., Fort Collins; Robert E. Balliew, Loveland; Mark A. Mathieu, Loveland; Darrell B. Johnsrud, Loveland, all of Colo.

[73] Assignee: Hewlett-Packard Company, Palo Alto, Calif.

[21] Appl. No.: 501,991

[22] Filed: Mar. 29, 1990

[51] Int. Cl.$^5$ .............................................. G01R 31/28
[52] U.S. Cl. .............................. 324/158 R; 324/73.1; 324/537; 371/27
[58] Field of Search .................. 324/158 R, 73.1, 537; 371/21.1, 22.1, 22.6, 27

[56] References Cited

U.S. PATENT DOCUMENTS

| 3,655,959 | 4/1972 | Chernow et al. .................. 371/21.1 |
| 4,045,736 | 8/1977 | Carpenter et al. ............... 324/158 R |
| 4,638,481 | 1/1987 | Crane et al. ............................ 371/27 |

*Primary Examiner*—Ernest F. Karlsen

[57] ABSTRACT

A method for use in an in-circuit tester automatically determines which test sequences must be regenerated as a result of a board modification, and automatically regenerates only the test sequences affected by the modification.

15 Claims, 5 Drawing Sheets

METHOD FOR REGENERATING IN-CIRCUIT TEST SEQUENCES FOR CIRCUIT BOARD COMPONENTS

FIELD OF THE INVENTION

The present invention relates generally to in-circuit testing of electronic components. More particularly, the present invention relates to a method for automatically determining the set of test sequences that need to be regenerated after a change has been made to a circuit board and then regenerating those test sequences.

BACKGROUND OF THE INVENTION

In-circuit testing apparatus are known in the art. See, for example, copending application Ser. No. 175,713, filed Mar. 31, 1988, now U.S. Pat. No. 4,888,548, entitled "Programmatically Generated In-Circuit Test of Digital to Analog Converters" and copending application Ser. No. 175,874 filed Mar. 31, 1988, now U.S. Pat. No. 4,947,106, entitled "Programmatically Generated In-Circuit Test of Analog to Digital Converters." See also U.S. Pat. Nos. 4,797,627, 4,853,928, 4,799,023, 4,785,235, 4,779,041, 4,652,814, 4,642,561 and 4,598,245. As is known, in-circuit testing involves electrically isolating the device or component under test ("DUT") from the remainder of the devices on the circuit board under test ("BUT"), then performing functionality tests on the DUT. Thus, in-circuit testing is a technique for testing devices on a BUT as if the DUT were disconnected from its surrounding circuitry, i.e., as if the DUT were a stand-alone device.

In prior art in-circuit testers, it is known to supply a software (or firmware) based automatic test sequence generator that analyzes a description of the BUT provided by the user, usually stored in a file called a "board object" (or "board file"), and then generates a test sequence for each component. The test sequences are then stored in "test files" for later recall. Two examples of in-circuit testers that employ automatic test sequence generators, board objects and test files as described herein are the Model HP 3065 and Model HP 3070 programmable in-circuit testers, both of which are manufactured by Hewlett-Packard Company, Palo Alto, Calif. In respect to the Model HP 3065, see, for example, "HP 3065 X/L Board Test System, Users' Manual Volume 1, System Reference", Hewlett-Packard Company Part No. 03065-90090, pp. 13-1 through 13-57 (1985). In respect to the Model HP 3070, see, for example, "HP 3070 Board Test System, Users' Manual, Board Test Fundamentals", Hewlett-Packard Company Part No. 44930A, pp. 2-33 through 2-48, 5-1 through 5-54 and 10-2 through 10-10 (1988). Both of these publications are incorporated herein by reference.

In the prior art, a major portion of the test sequence generation process for each component consists of automatically determining how to electrically isolate the component so that it can be tested as if it were a stand-alone device. In many cases, however, the DUT cannot be completely isolated, and therefore the test sequence for that DUT must compensate for, or take into consideration, the effect of surrounding devices on the board that affect the test sequence for the DUT. For example, a test sequence for a particular DUT must take into account any devices connected in parallel with the DUT in order to obtain accurate results. Thus, each test sequence must take into account information about both the particular DUT and surrounding components and how they are connected. This information is called "dependency" information. In the prior art, the dependencies are automatically determined and taken into account during the test sequence generation process.

A particular shortcoming of the prior art is that every time even a single board component is changed, or the board topology is slightly modified, the entire test sequence for the BUT must be regenerated, and therefore the test sequence generation process must be repeated for every device on the board. This is so because there is no efficient way, according to the prior art, for the test sequence generation program to determine just which surrounding components would be affected and which surrounding components would not be affected by the change. Moreover, it is also often difficult for the board test programmer to make this determination. It is therefore desirable to provide a method for use in an in-circuit tester that will automatically determine which particular test sequences must be regenerated when the circuit board is modified without regenerating the entire test sequence (i.e., for the entire BUT), then regenerate the test sequence for the modification. The present invention achieves this goal.

SUMMARY OF THE INVENTION

A method of operating an in-circuit tester comprises first providing, in the in-circuit tester, information defining details of a circuit board, including data indicative of devices to be tested on the board. Test sequences for the devices to be tested are then generated according to the information provided to the in-circuit tester. According to the invention, the method automatically determines, for each device for which a test sequence was generated, whether other devices on the board affect the test sequence for the device to be tested, and the method automatically identifies those other devices. The identity of the other devices determined to affect the test sequence are then stored in a memory of a computer associated with the in-circuit tester. Thus, in the event of a modification to the board, the computer has stored in its memory, data indicative of the other devices that should be considered in deciding whether to generate new test sequence(s) for each device.

The method of the present invention also detects when a board has been modified, and in response to detecting a board modification, first automatically identifies the devices for which new test sequences should be generated, then generates new test sequences for only the devices that were identified as requiring new test sequences.

DETAILED DESCRIPTION OF THE PREFERRED EMBODIMENT

Figure 1:
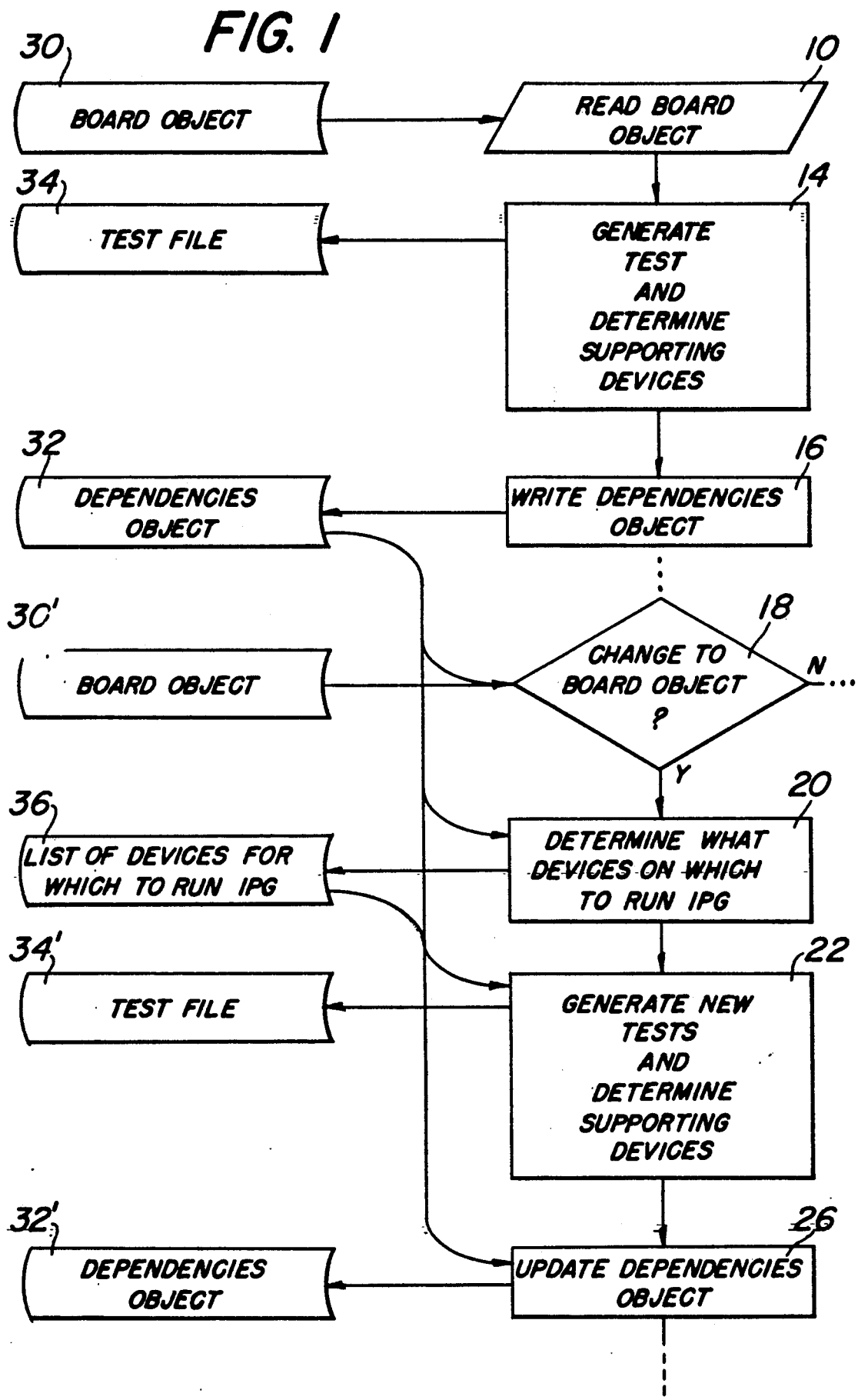
FIG. 1 is a flowchart for an improved automatic test sequence generation method according to the present invention.

Referring now to the drawings, wherein like numerals represent like elements, there is illustrated in FIG. 1 a flowchart setting forth a method according to the present invention for automatically determining which test sequence(s) must be regenerated as a result of a modification to the circuit description of the board to be tested, and automatically regenerating the test sequence(s) affected by a specific modification. The method illustrated in FIG. 1 may be employed in any in-circuit tester of the type previously discussed in the background section hereof, such as the aforementioned commercially available Hewlett-Packard Company Model HP 3065 or Model HP 3070 programmable in-circuit testers, but the invention is by no means limited thereto.

In FIG. 1, blocks 10, 14 and 22 (except elements 40, 42 and 46 of FIG. 2), 30, 30', 34, 34' and 36 represent steps performed, and input received and output provided, by the aforementioned Model HP 3065 or Model HP 3070, as well as other prior art in-circuit testers. Blocks 16, 18, 20, 14 and 22 (elements 40, 42 and 46 of FIG. 2), 26, 32 and 32' represent additional steps performed, and additional output provided, when the modification of the present invention is implemented. As illustrated in FIG. 1, a user provided file, referred to herein as a "board object" 30, is first read into a computer or control system associated with the in-circuit tester, as shown at block 10. As discussed above, and as well known in the art, the board object 30 is a file containing an electrical description of a particular board, including what devices are mounted on the board and how they are interconnected. Next, as in the prior art, a preprogrammed test generation routine 43 (FIG. 2) is executed and a test file 34 is written to a memory, such as a disk. The test generation routine 43 is a program that automatically determines how to isolate the devices to be tested from their surrounding circuitry, and then automatically generates test sequences for the individual devices. (Note that in a preferred embodiment, the test generation routine 43 is actually not a separate program, but is part of a larger program that generates test sequences and determines supporting devices for the devices to be tested.) The test file 34 for a given board contains the test sequences for all the devices on the BUT, and therefore provides a program to operate the in-circuit tester. The test generation routine 43 (FIG. 2) may be one employed in any prior art in-circuit tester. For simplicity, the test generation routine 43 is also referred to herein as IPG (Integrated Program Generator), which is the name of the particular test generation routine employed by the aforementioned Model HP 3065 and Model HP 3070, but the use of this term herein is intended to cover any test generation routine of any in-circuit tester. According to the invention, however, the IPG also produces a "supporting devices list", as shown at block 14. The supporting devices list for a particular DUT is a list of all the devices (referred to herein as "supporting devices") on the board which affect the testing of that DUT, as will become evident hereinafter. Also according to the invention, a file called a "dependencies object" 32 is also compiled by merging the supporting devices list to a copy of the existing board object 30, and the dependencies object is then written to disk, as shown at block 16. Thus, at this point, there will preferably be created a board object 30, a dependencies object 32, and a set of one or more test sequences for the devices on the board. The test sequences can either be stored in a single test file 34 representing a given board, or in separate test files each representing a particular device. Furthermore, according to the invention, the dependencies object 32 comprises a supporting devices list for each device on the board. It should be clear at this point that the terms "object" (as in "board object"), and "file" (as in "test file") are interchangeable. The particular usage herein is simply a matter of convention.

Assume now that a board is modified in some way, e.g. a component is changed after its test file 34 has been generated, and, as in the prior art, this is reflected in a modified board object provided by the user, as represented by 30'. According to the invention, the modified board object 30' is read into the in-circuit tester and a determination is made whether changes to the board definition are present in the modified board object 30' as indicated at 18. This determination is made by comparing the dependencies object 32 (which includes the board description from the old board object 30) to the modified board object 30'. The remainder of the flowchart illustrates the events that occur when a modification is detected. The events that occur when no modifications are detected are not illustrated since they do not form a part of the present invention.

Upon detecting a board modification at 18, a routine 20 (described herein) is executed for the purpose of identifying the devices for which IPG needs to be rerun for the purpose of generating new test sequences for those devices. Although steps 18 and 20 are shown in the drawing as occurring sequentially, for all practical purposes the differences and the devices affected by the differences may be determined at the same time. The result of executing the routine 20 is a list of devices for which IPG needs to be re-run, as shown at block 36. The list 36 is employed by the next routine 22 which employs IPG to generate test sequences for the new, changed or otherwise affected devices. The result of executing routine 22 is a modified test file 34' containing test sequences for the modified board. Next, steps 22 and 26 are performed in the same manner as steps 14 and 16 described above (and below) to arrive at a modified dependencies object 32' for the modified board.

At this point, some important differences between the prior art and the invention should be noted. In the prior art, the original, or old, board object 30 is not used by the system after the modified board object 30' is read in. However, in the invention, important information from the original board object 30 is retained in the dependencies object 32 and is employed to determine what board change(s) took place and what test sequences were affected by the change(s). Briefly, the nature of the changes, or modifications, are determined by comparing the modified board object 30' to the dependencies object 32. This routine will be described in more detail hereinafter, but for now, it is represented simply as block 18. Also, it should be appreciated that, according to the invention, a comparison is made between the dependencies object 32 and the modified board object 30', as shown at block 20, and a predefined set of instructions (to be described herein) is utilized to determine the board components for which new tests need to be generated. As mentioned above, blocks 18 and 20 are actually part of the same routine but are shown as two distinct steps in the drawing to emphasis the distinct functions (i.e., detecting whether the board description has changed, and determining the effects of the change) performed. The generation of new tests and determination of supporting devices at block 22 is essentially the same routine as performed at block 14, but importantly, new test sequences are not generated for every component on the board. Rather the list of devices 36, as determined by the previous step 20, is utilized by IPG along with the modified board object 30' to generate test sequences only for the new, changed, or otherwise affected devices that require them.

Figure 2:
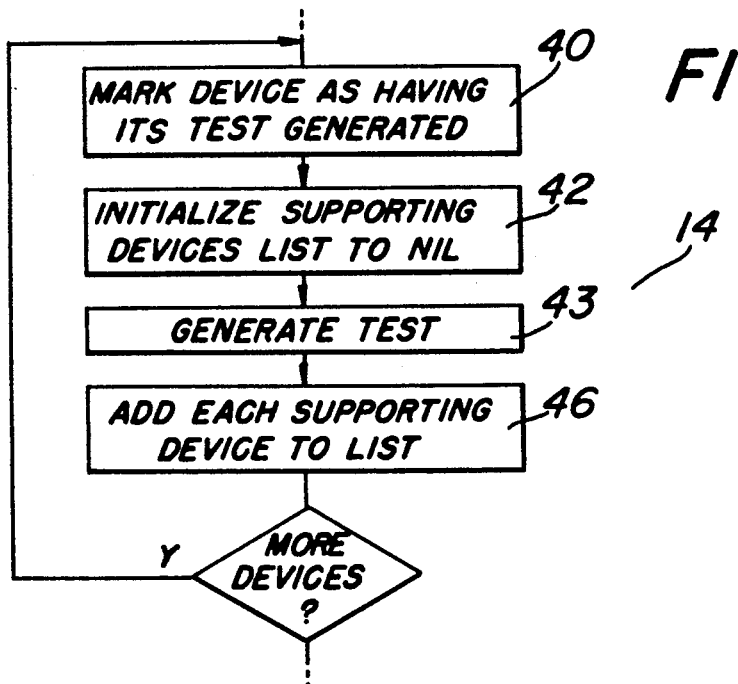
FIG. 2 is an expanded flowchart for the "Generate Test and Determine supporting Devices" block of FIG. 1.

Referring now to FIG. 2, block 14 (and block 22) of FIG. 1 entitled "Generate Test and Determine Supporting Devices", will be explained in greater detail.

The routine illustrated in FIG. 2 is cyclic and is repeated for each device on the board to write a test sequence for the device and determine its supporting devices. First, the device under consideration is "marked", as shown at block 40. The mark is used by the "Write Dependencies Object" blocks 16, 26, and is discussed below with reference to FIG. 3. The mark is internal to IPG and has no effect on the board object. After initializing the supporting devices list (if it isn't already initialized), a test is written for each device or component, block 43. As mentioned, the IPG program determines all of the devices that affect the test sequence generation for the device under consideration. These devices are the "supporting devices" for the device under consideration. Next, each supporting device is added to the supporting devices list for the device under consideration, as shown at block 46. Preferably, the device itself is included in the supporting devices list for the device under consideration. After the steps shown in FIG. 2 are performed for each device on the board, the program flow continues at block 16 of FIG. 1. Thus, the routine 14 provides a test sequence and a list of supporting devices for each device under consideration on the board. It should be appreciated that when this routine is again executed at step 22 of FIG. 1, it will be run only for those devices indicated by the preceding step 20.

Figure 3:
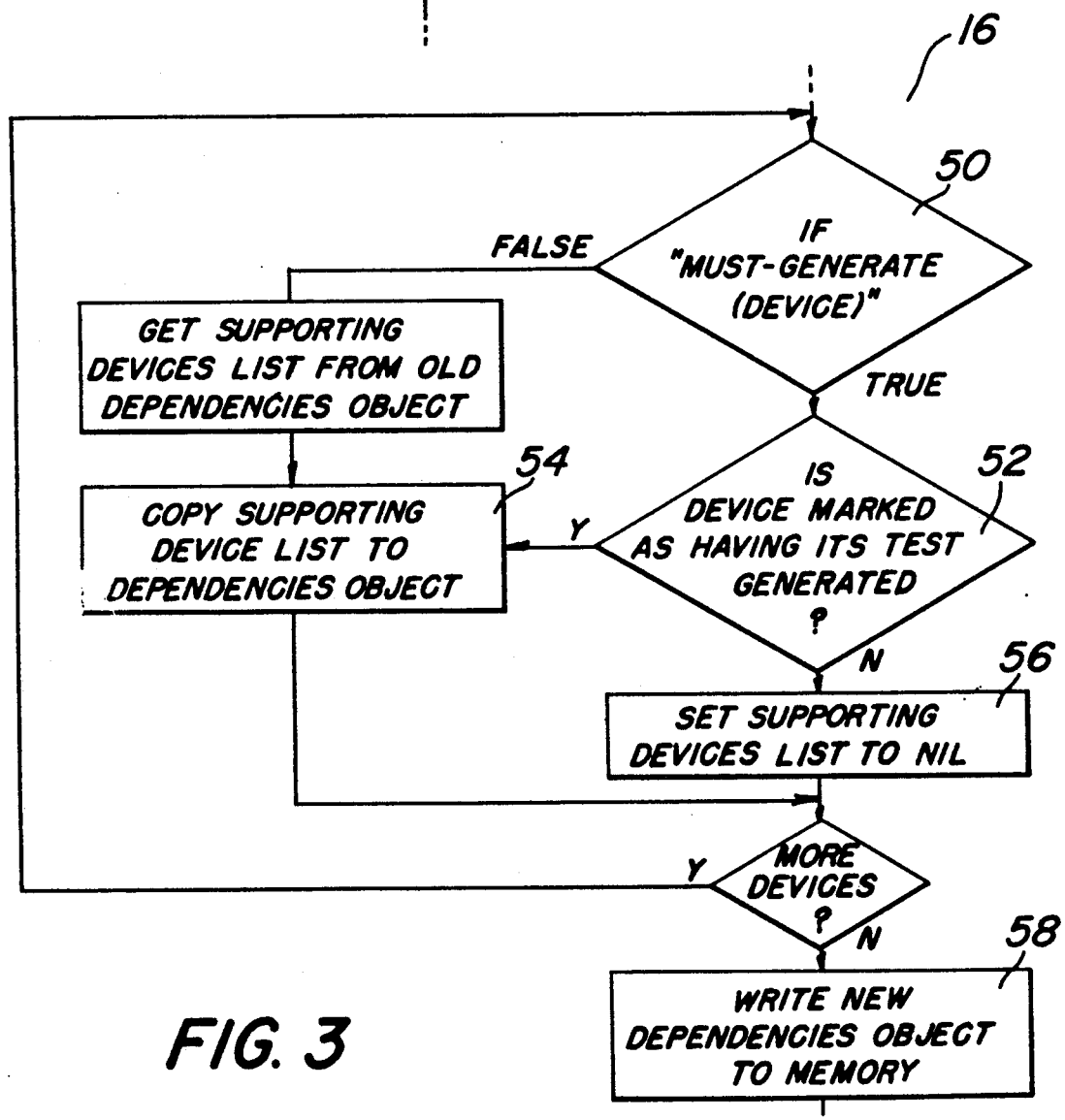
FIG. 3 is an expanded flowchart for the "Write Dependencies Object (IPG)" block of FIG. 1.

Referring now to FIG. 3, the "Write Dependencies Object" routine of block 16 (and block 26) of FIG. 1 will be described in greater detail. In sum, the "Write Dependencies Object" routine saves the board object 30, together with all of the supporting devices lists provided by routine 14 (or routine 22), to memory such as disk, as the dependencies object 32 (or 32'). Thus, the dependencies object 32 will contain the original, or old, board file 30, as well as all of the supporting devices lists, i.e., the supporting devices for all of the devices under consideration on the board. With respect to block 26, the "Update Dependencies Object" routine also performs a check to determine whether existing test sequences, if any, for devices that did not have test sequences regenerated are valid. If the existing test sequence for a particular device is found to be valid, the supporting devices list for that device is simply copied from the dependencies object 32. If found invalid, the supporting devices list for the device is set to a predefined state, e.g. NIL, that the system will recognize. When performed as routine 26 of FIG. 1, the "Write Dependencies Object" copies the valid supporting devices lists from the old dependencies object 32 to the modified dependencies object 32'. It will be apparent to those skilled in the art that there is very little difference between the "Write Dependencies Object" block and the "Update Dependencies Object" block.

For each device under consideration a "Must-Generate (Device)" routine is executed, as shown at block 50. This routine is described in further detail below. The "Must-Generate (Device)" routine returns either a TRUE or FALSE indication depending upon the outcome of certain tests which are described below. If a TRUE indication is returned, a determination is made as to whether the device under consideration has been marked as having its tests generated, as shown at block 52. (Recall that each device to which IPG was applied was "marked". See block 40, FIG. 2.) If the outcome of the determination is negative (or FALSE), the supporting devices list for the device under consideration is set to a predefined state such as NIL, as shown at block 56. If the outcome of the determination is positive (or TRUE), the process proceeds to block 54 where the supporting devices list created at block 46 for the device under consideration is copied to the dependencies object 32 (or 32'). As indicated in the figure, block 54 is also executed upon a FALSE indication by the "Must-Generate (Device)" routine, block 50, however the source of the supporting devices list is the old dependencies object. Next, after the steps indicated by block 54 or block 56 are performed, the dependencies object 32 or 32' is written to memory, such as disk, as shown at block 58. It will be appreciated that the routine illustrated in FIG. 3 is also cyclic and is repeated for each device on the board.

The "Must-Generate (Device)" routine illustrated at block 50 of FIG. 3 will now be explained in greater detail. The "Must-Generate (Device)" routine 50 uses the dependencies object 32 and the board object 30' to determine whether a test sequence for a given device needs to be generated. As mentioned, the dependencies object 32 contains the original (i.e., unmodified) board description (as represented in the board file 30) which was employed to generate the most previously generated test sequences, as well as the supporting devices list for each device. The supporting devices list identifies the specific information in the board object that is germane to the test sequences for the devices on the board. The "Must-Generate (Device)" routine 50 traverses the supporting devices lists and compares the supporting devices information for the given devices with the corresponding information in the board object 30. If a difference is found, a new test sequence for the device must be generated. Note that a dependencies object 32 will not always exist at this time; for example, the first time a test sequence is developed for the devices on the board there will have been no prior run of IPG, and therefore no dependencies object 32. Note also that, in the "Write-Dependencies-Object" routine, the supporting devices list for each device that should have had a test generated but didn't is set to a predefined state such as NIL. Thus, when the Must-Generate (Device) routine encounters a supporting devices list that is set to the predefined state or NIL, it ascertains that the test for that device needs to be generated.

Figure 4:
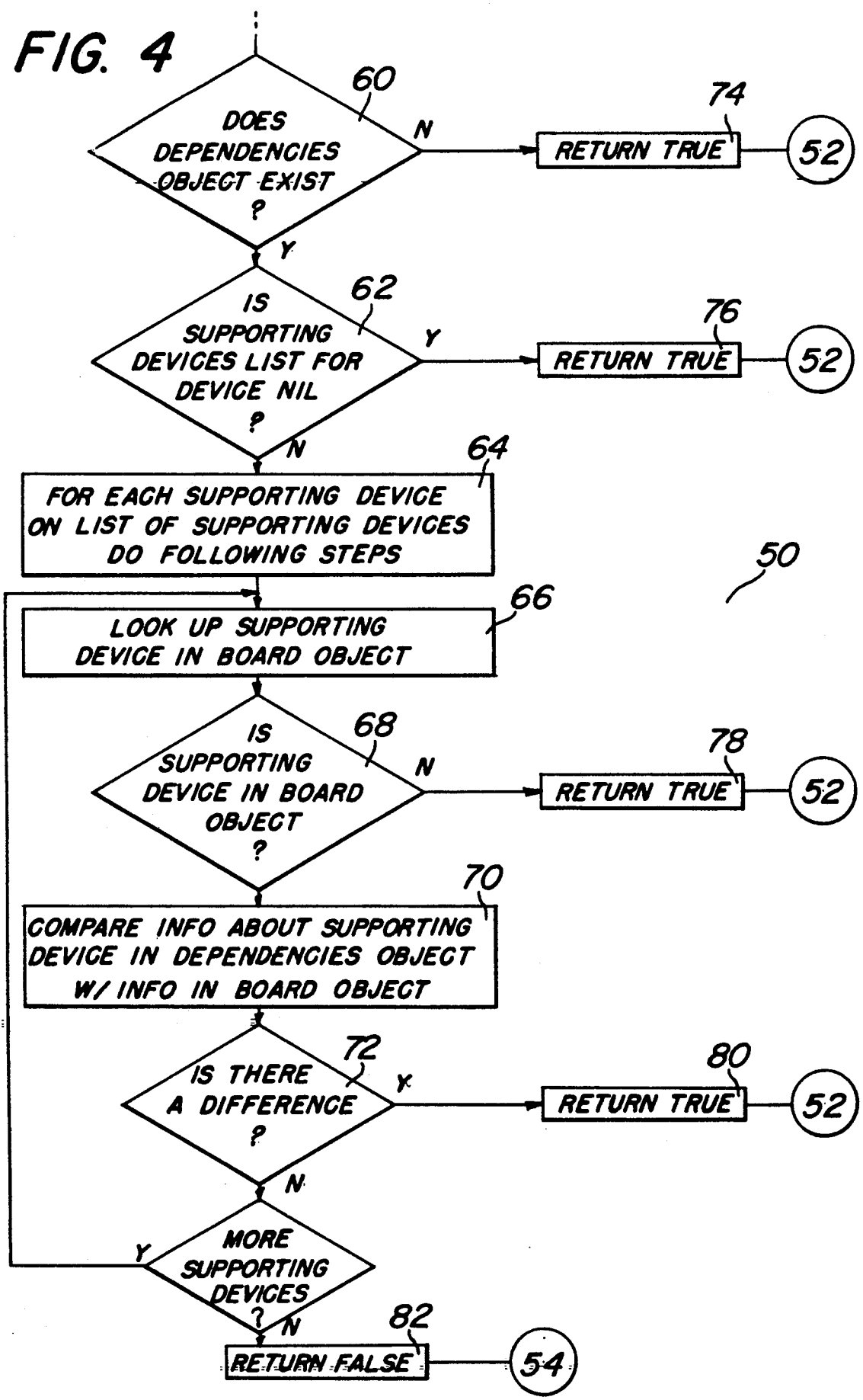
FIG. 4 is an expanded flowchart for the "If Must-Generate (Device)" block of FIG. 3.

Referring now to FIG. 4, the "Must-Generate (Device)" routine is illustrated in detail. At block 60, a determination is made as to whether a dependencies object 32 exists for this device and, if so, whether the device is in the dependencies object. If either check fails, a TRUE indication is returned, as shown at block 74. Next, a determination is made as to whether the supporting devices list for this device is set to the predefined state or NIL, as illustrated at block 62. If it is, then a TRUE indication is returned as shown at block 76. Next, for each supporting device on the supporting devices list, the following steps are performed. A determination is made as to whether each supporting device is identified in the modified board object 30', as shown at block 68. If a supporting device is not identified in the board object 30', then a TRUE indication is returned, as illustrated at block 78. If the supporting device is identified in the board object 30', then a comparison between the information respecting the supporting device in the dependencies object 32 with corresponding information in the board object 30' is made, as shown at block 70. A determination is then made as to whether there is a difference, as shown at block 72. If there is a difference, then a TRUE indication is returned, as shown at block 80. If there is no difference, steps 60–80 are repeated with the next supporting device. A FALSE is returned after going through all the supporting devices on the list and finding no difference.

Figure 5:
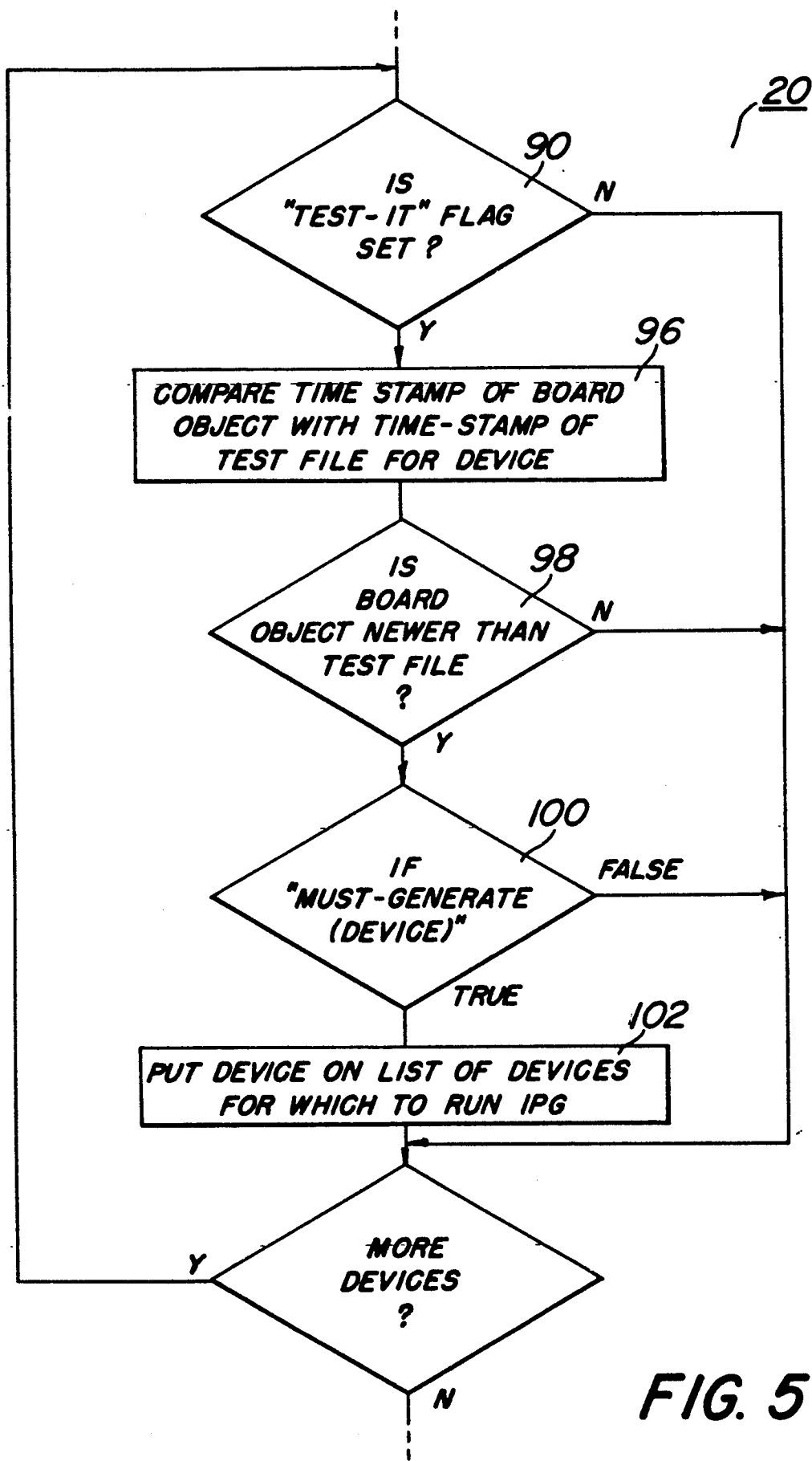
FIG. 5 is an expanded flowchart for the "Determine What Devices On Which To Run IPG" block of FIG. 1.

Referring now to FIG. 5, the "Determine What Devices On Which To Run IPG" routine of FIG. 1, block 20, will be explained. First, at block 90, a "test-it" flag is checked to determine whether this device is to be tested. If the flag is not set, no further action is taken. If the flag is set, a time stamp in the board file is compared with a time stamp of the test file for the device, as shown at block 96. (Note that the "test-it" flag is maintained in the board object 30 for each device. This flag may be turned on and off by the user. The "test-it" flag, or its equivalent, is known in the prior art.) If the board object is newer than the test file, the "Must-Generate (Device)" routine 50 is called, as shown at block 100. If a TRUE indication is returned, then the device is placed on a list of devices on which to run IPG, as shown at block 102. The program flow then continues at block 22, FIG. 1. Note that the "Must-Generate (Device)" routine is the same routine used in the "Write Dependencies Object" routine. This has been discussed above in connection with block 16.

Figure 6:
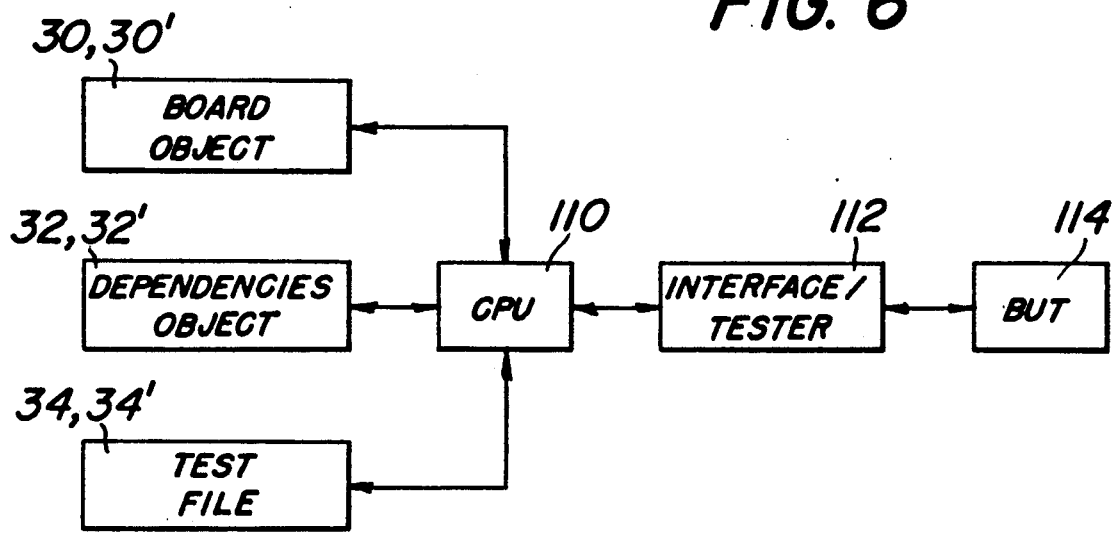
FIG. 6 depicts exemplary apparatus for performing the automatic test generation process according to the present invention.

An exemplary in-circuit test generation apparatus embodying the invention will now be described. Referring to FIG. 6, an apparatus according to the present invention comprises processing means 110, coupled to interface/tester means 112 coupled to a board under test, or BUT, 114. Also coupled to the processing means 110 are means for storing board objects 30, 30', means for storing dependencies objects 32, 32', and means for storing test files 34, 34'. Preferably, the objects 30, 30', 32, and 32' and the files 34, 34' are stored in a memory such as magnetic disk or tape, but the invention is not so limited. Bubble memory, optical disk, etc., devices may also be employed.

A preferred format for the dependencies file will now be described. As discussed above, the dependencies object 32 and modified dependencies object 32' are each an augmented version of an existing board object 30 or modified board object 30'. The board object 30 or 30' contains an electrical description of the board, including the following information:
what devices are on the board,
component values,
part numbers,
connectivity, and,
node accessibility.

The dependencies object 32 or 32' appends to the board object 30 or 30', for each device, a list of the devices on the board that IPG considered when it was writing the test for the device. This list is the previously described supporting devices list.

Figure 7:
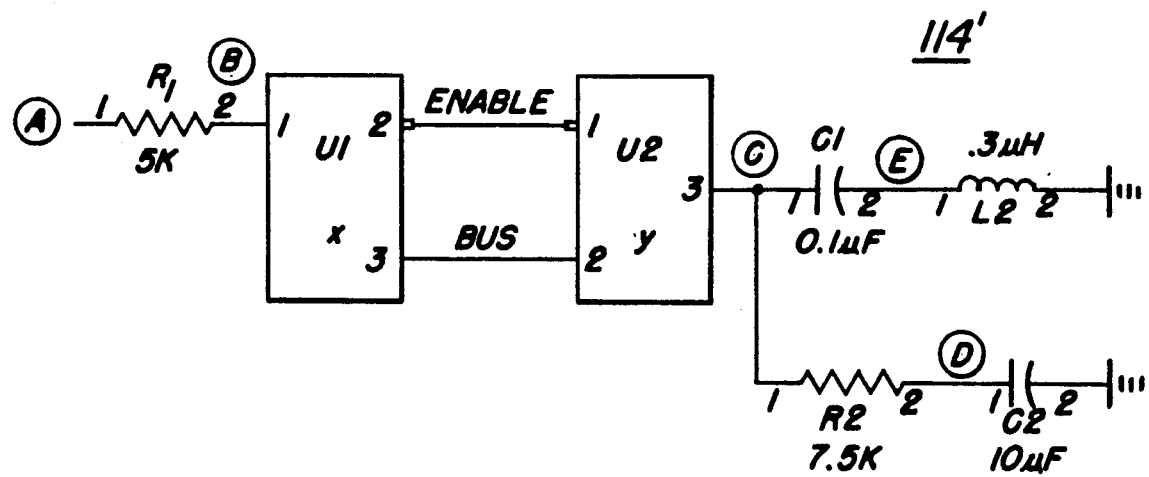
FIG. 7 is an exemplary circuit board provided for describing the format of a dependency object according to the present invention.

FIG. 7 illustrates an exemplary BUT 114' and is provided for the purpose of further explaining the operation of the method of the present invention and the format of the dependencies object. The exemplary BUT 114' comprises a 5K ohm resistor R1, coupled between nodes A and B, with pin 1 on node A and pin 2 on node B. Node A is connected to R1, pin 1, and node B is connected to R1, pin 2 and U1, pin 1. According to the invention, R1 may be represented in the dependencies object as follows:
R1 is a resistor having a value of 5K ohm;
pin 1 of R1 is connected to node A;
pin 2 of R1 is connected to node B
node A contains R1.1 (i.e., pin 1 of R1)
node B contains R1.2, U1.1 (i.e., pin 2 of R1 and pin 1 of U1)

BUT 114' also comprises digital device U1 of type X. Pin 1 of U1 is connected to node B, pin 2 of U1 is connected to node ENABLE, and pin 3 of U1 is connected to node BUS. BUT 114' further comprises digital device U2 of type Y. Pin 1 of U2 is connected to node ENABLE, pin 2 of U2 is connected to node BUS, and pin 3 of U2 is connected to node C. As indicated in the figure, node C is further coupled to pin 1 of a capacitor C1 and pin 1 of a resistor R2. Thus, the following additional information may be recorded in the dependencies file for U1:
U1 is a digital device of type X
pin 1 of U1 is connected to node B
pin 2 of U1 is connected to node ENABLE
pin 3 of U1 is connected to node BUS
U2 is digital device of type Y
pin 1 of U2 is connected to node ENABLE
pin 2 of U2 is connected to node BUS
pin 3 of U2 is connected to node C
node B contains R1.2, U1.1 (i.e., pin 2 of R1 and pin 1 of U1)
node ENABLE contains U1.2, U2.1 (i.e., pin 2 of U1 and pin 1 of U2)
node BUS contains U1.3, U2.2 (i.e., pin 3 of U1 and pin 2 of U2)
node C contains U2.3, C1.1, R2.1 (i.e., pin 3 of U2, pin 1 of C2 and pin 1 of R2)

The remaining components on the board are represented in the dependencies file with similar information; i.e., information identifying each component and describing how it is connected in the circuit, and identifying its supporting devices. For the above example, the supporting devices lists could be in the following form:

| device: | list |
|---|---|
| R1: | R1 |
| U1: | U1,U2 |
| U2: | U1,U2 |
| C1: | C1,L2,R2,C2 |
| L2: | C1,L2,R2,C2 |
| R2: | C1,L2,R2,C2 |
| C2: | C1,L2,R2,C2. |

In summary, there has been described a method for automatically generating in-circuit test sequences for individual devices on a circuit board under test. The invention improves upon the prior art by providing modifications to prior art in-circuit tester software, whereby the program for generating test sequences for individual devices saves information concerning the devices upon which the test sequences depend. This information can then be utilized to determine which particular test sequences must be regenerated as a result of a modification to the BUT.

The foregoing description of the preferred embodiment is for the purpose of illustration only, and is not intended to be exhaustive or to limit the scope of the invention in any respect. Rather, reference should be made to the appended claims for the purpose of construing the true scope of the invention described herein.

What is claimed is:

1. Method of operating an in-circuit-tester comprising the steps of:
   (a) providing in the in-circuit tester information defining details of a circuit board, including data indicative of devices to be tested on the board;
   (b) generating, according to at least the information provided in step (a), test sequences for the devices to be tested on the board;
   (c) automatically determining, for each device for which a test sequence was generated in step (b), whether other devices on the board affect the test sequence for the device to be tested and identifying the other devices; and,
   (d) storing data indicative of the results of step (c) in a memory associated with the in-circuit tester;
   the in-circuit tester thereby having stored in the memory, data indicative of the other devices that should be considered in deciding whether to generate new test sequence(s) for each device.

2. Method according to claim 1 further comprising the step of detecting when the board has been modified and performing the following steps in response thereto:
   (e) automatically identifying, based at least the data stored in step (d), the devices for which new test sequences should be generated; and,
   (f) generating new test sequences for only the devices identified in step (e).

3. Method according to claim 2 wherein the step of determining whether a board has been modified comprises the steps of comparing at least a portion of the information provided in step (a) with subsequent information regarding the board provided by a user.

4. Method according to claim 2 wherein steps (e) and (f) comprise:
   (i) identifying devices on the board that have been added, removed or changed as a result of the board modification;
   (ii) determining which devices require generation of new test sequences as a result of the devices identified in step (i); and,
   (iii) regenerating new test sequences for the devices identified in step (ii).

5. Method according to claim 3 wherein a first record comprising data indicative of both (i) the information provided in step (a) before the subsequent information was provided by the user and (ii) the other devices identified in step (c) is maintained in the memory, and a separate second record comprising data indicative of the subsequent information provided by the user and defining the details of the modified board is also stored in the memory.

6. Method according to claim 5 wherein the data indicative of other devices in the first record is compared to data in the second record to determine whether, for a particular device to be tested, the test sequence for the particular device needs to be regenerated.

7. Method according to claim 2 wherein data indicative of the test sequences for the devices to be tested are stored in at least one test file that includes an indication of the time of a most previous modification of the test file, and data indicative of the information provided in step (a) is stored in a board object that includes an indication of the time of a most previous modification of the board object, and step (e) includes the step of comparing the time indications in the test file and board object.

8. Method according to claim 1 wherein the other devices identified in step (c) define supporting devices, and step (c) further comprises the step of generating a supporting devices list for each device for which a test sequence was generated in step (b).

9. Method according to claim 8 wherein the information provided in step (a) defines a board object, and step (d) further comprises the steps of combining the board object and the supporting devices lists to define a dependencies object, and storing the dependencies object.

10. Method of operating an in-circuit tester comprising the steps of:
    (a) providing in the in-circuit tester information defining details of a circuit board, including data indicative of devices to be tested on the board;
    (b) generating, according to at least the information provided in step (a), test sequences for the devices to be tested on the board;
    (c) automatically determining, for each device for which a test sequence was generated in step (b), whether other devices on the board affect the test sequence for the device to be tested and identifying the other devices;
    (d) automatically identifying, based at least upon the determination of step (c), the devices for which new test sequences should be generated when the board has been modified;
    (e) generating new test sequences for only the devices identified in step (d); and,
    (f) storing data indicative of the results of step (c) in a memory associated with the in-circuit tester.

11. Method according to claim 10 wherein steps (d) and (e) comprise:
    (i) identifying devices on the board that have been added, removed or changed as a result of the board modification;
    (ii) determining which devices require generation of new test sequences as a result of the devices identified in step (i); and,
    (iii) regenerating new test sequences for the devices identified in step (ii).

12. Method according to claim 10 wherein data indicative of the test sequences for the devices to be tested are stored in at least one test file that includes an indication of the time of a most previous modification of the test file, and data indicative of the information provided in step (a) is stored in a board object that includes an indication of the time of a most previous modification of the board object, and step (d) includes the step of comparing the time indications in the test file and board object.

13. Method according to claim 10 wherein the other devices identified in step (c) define supporting devices, and step (c) further comprises the step of generating a supporting devices list for each device for which a test sequence was generated in step (b).

14. Method according to claim 13 wherein the information provided in step (a) defines a board object, and step (f) further comprises the steps of combining the board object and the supporting devices lists to define a dependencies object, and storing the dependencies object.

15. In an in-circuit tester, a method of generating in-circuit test sequences for evaluating circuit board devices comprising the steps of:
  (a) reading into the in-circuit tester a first file containing data indicative of details of a board to be tested, including devices to be tested on the board;
  (b) automatically generating, according to at least a portion of the first file, a sequence of test steps to be performed on the devices to be tested;
  (c) automatically identifying, according to at least the results of step (b), supporting devices for each device for which a test sequence was generated in step (b), the supporting devices for a device being other devices on the board upon which the test sequence for a device to be tested is determined to depend;
  (d) automatically generating a second file comprising the supporting devices identified in step (c);
  (e) reading into the in-circuit tester a third file containing data indicative of details of a modified board to be tested, including devices to be tested on the modified board;
  (f) automatically identifying, according to at least portions of the second and third files, only any devices for which new test sequences should be generated as a result of the board modification; and,
  (g) automatically generating new test sequences for only the devices identified in step (f).

* * * * *